March 2, 1971 W. E. ENGELER 3,566,457

BURIED METALLIC FILM DEVICES AND METHOD OF MAKING THE SAME

Filed May 1, 1968

Inventor:
William E. Engeler,
by John F. Ahern
His Attorney.

United States Patent Office 3,566,457

Patented Mar. 2, 1971

3,566,457
BURIED METALLIC FILM DEVICES AND METHOD OF MAKING THE SAME

William E. Engeler, Scotia, N.Y., assignor to General Electric Company

Continuation-in-part of application Ser. No. 675,225, Oct. 13, 1967. This application May 1, 1968, Ser. No. 725,683

Int. Cl. B01j *17/00;* H01g *13/00*

U.S. Cl. 29—571 9 Claims

ABSTRACT OF THE DISCLOSURE

Electrical conductors and field plates utilized in integrated circuit components are buried in insulating media by forming an insulated film on the semiconductor substrate, depositing a metal thereover which is nonreactive with the insulator at temperatures of the order of 1100° C., and covering the conductive film with another insulating film. After all fabrication steps for the integrated circuit device are completed, contact to the metallic layer is made by etching a hole through the last deposited insulating film at one point with an etchant which is nonreactive with the metallic film, and metalizing the device in that region, making contact with the buried conductor. Such buried conductors may be utilized as conductors in printed circuit and monolithic semiconductor devices, as capacitor plates, and as gate electrodes in field-effect transistors.

Figure 1:
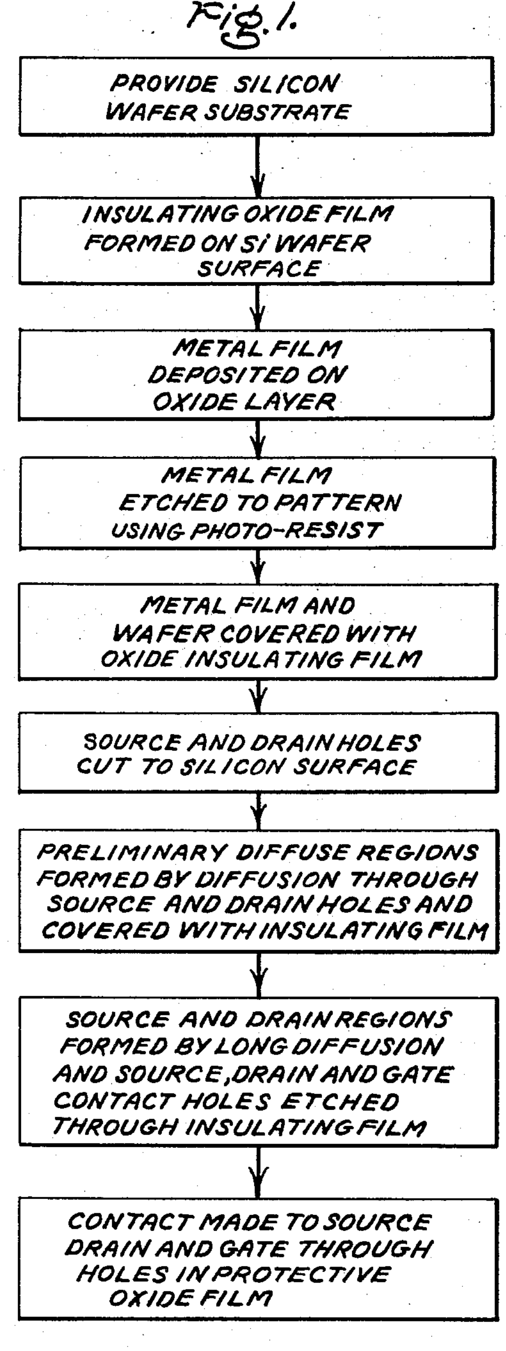

This application is a continuation-in-part of my copending application Ser. No. 675,225, filed Oct. 13, 1967 and assigned to the present assignee.

The present invention relates to integrated circuit and monolithic semiconductor devices and the method of making the same. More particularly, the present invention relates to such devices as utilized as an integral part thereof, one or more electrical conductors or electrically conducting plates required to be buried within an insulating medium in such devices. This application is related to the copending concurrently filed applications 675,288, filed Oct. 13, 1967—Brown, Engeler, Garfinkel and Gray; 679,975 filed Nov. 2, 1967—Brown and Engeler; 675,227 filed Oct. 13, 1967 (now abandoned in favor of application Ser. No. 725,825, filed May 1, 1968) Brown and Garfinkel; and 675,226, filed Oct. 13, 1966 (now abandoned in favor of application Ser. No. 725,825, filed May 1, 1968—Brown and Engeler all of which are assigned to the present assignee.

In the fabrication of semiconductor devices, particularly integrated circuits and monolithic units, it is desirable that a metallic conductor be formed within and totally enclosed by a surrounding insulating medium. In the formation of such devices, it is often difficult to deposit or form a conductive element and keep the conductive element from adversely interacting with, the insulating media surrounding it to their mutual detriment. Similarly, difficulties are encountered by utilization of certain materials which must later be subjected to very high temperatures in order that diffusion and other fabrication steps in the formation of semiconductor devices are performed. At these temperatures some metals are highly reactive and some become molten and plates and conductive strips thereof are adversely effected.

Accordingly, it is an object of the present invention to provide semiconductor devices utilizing buried electrical conductors and conducting plates which may be formed during semiconductor processing and which are uneffected by subsequent semiconductor processing, Still another object of the present invention is to provide semiconductor devices utilizing metallic components which are nonreactive with the materials with which they are in contact, Yet another object of the present invention is to provide improved methods of forming semiconductor devices containing self-contained conducting metallic films.

Another object of the present invention is to provide improved integrated circuits having metallic conductors therein, Still another object of the invention is to provide a buried protective metallic plate over active portions of semiconductor devices subject to external effects which may deleteriously affect device characteristics.

Still another object of the present invention is to provide improved field-effect transistors and methods of making the same.

Briefly, in accord with the present invention, I provide improved, integrated-circuit, semiconductive devices and components therefor, wherein a semiconductive substrate is first coated with a first insulating layer, and a thin metallic film of a material such as molybdenum or tungsten which is nonreactive with insulators utilized in semiconductive devices, and which may withstand high temperatures without degradation is formed over the insulating layer. The metallic layer is patterned to any desirable shape and form by conventional photoresist and etching techniques and a second insulating layer is deposited over the entire device surface covering the patterned metallic film. Immediately thereafter, or after subsequent heating, diffusion, alloying, or other semiconductor fabrication steps, contact is made to the buried metallic film by etching through the covering insulating layer with an etchant which dissolves the material covering the patterned metallic film but which does not attack the metallic film. Contact is then made to the metallic film through the hole etched in the surrounding insulator.

The novel features believed characteristic of the present invention are set forth in the appended claims. The invention itself, together with further objects and advantages thereof, may best be understood with reference to the following detailed description, taken in connection with the appended drawing in which, FIG. 1 is a flow chart describing the formation of a simple buried metallic conductor in accord with the present invention.

FIG. 2*a–g* is a series of illustrations of a semiconductor device in the process of fabrication, corresponding to the various steps of the flow diagram of FIG. 1.

In FIG. 1, a flow chart representing the simplest mode of fabrication of semiconductor devices in accord with the present invention is illustrated. While the invention may be practiced in the fabrication of monolithic integrated circuitry and the like utilizing germanium, silicon, gallium arsenide, or any other desirable semiconductive material as the substrate, for purposes of simplicity and ease in description, the invention will be described herein with respect to the formation of semiconductor devices and circuits utilizing a silicon chip or wafer as the substrate.

The process illustrated in FIG. 1 is started utilizing a silicon chip or wafer which may, for example, be one inch in diameter and 0.010 inch thick. The silicon wafer has a pair of major surfaces which are monocrystalline and preferably have a major crystallographic orientation desirable for the formation of semiconductor devices as for example, parallel with the (1, 1, 1) plane. A thin layer of an insulator which is sufficient to electrically insulate the silicon substrate from future conductors deposited thereupon and which, conveniently, has the characteristic of protecting the surface of the silicon against surface leakage or the creation of surface states which may cause degradation thereof is formed upon one major surface of the silicon substrate. Such a layer may conveniently be one or more films in any order or number of materials such as silicon oxide, silicon nitride, or an amorphous combination of silicon, oxygen, and nitrogen such as is disclosed in the copending application of F. K. Heumann, application Ser. No. 598,305, filed Dec. 1, 1966, now abandoned and assigned to the present assignee. This material is generally referred to as silicon oxynitride. For simplicity of explanation it will be assumed that a silicon oxide film 11 is formed upon a major surface of silicon wafer 10. Such a film may be 1000 A.U. thick and may be formed by heating the silicon substrate for approximately one hour in a dry oxygen atmosphere at a temperature of approximately 1100 to 1200 degrees C. Such conditions form a dense, uniform, thermally-grown layer of silicon dioxide which serves as an insulating and passivating agent for the silicon. In accord with the present invention, a layer of a metal which is nonreactive with silicon oxide (or with silicon nitride or with silcon oxynitride if the same utilized as the insulating and passivating layer), as for example molybdenum or tungsten, is formed upon the silicon oxide layer 11 upon silicon wafer 10. After the formation of a molybdenum film, for example, of, for example, a thickness of 1000 A.U. to 5000 A.U. by vacuum evaporation of sputtering upon a substrate heated to approximately 400 to 500° C., for example in an atmosphere of five micron pressure of an inert gas, as for example argon, the metal film is patterned in the shape and dimension desired in accord the use to which it is to be placed. The deposition and utilization of a molybdenum film upon a silicon dioxide film is disclosed in the copending application of Tiemann et al., Ser. No. 606,242, filed Dec. 30, 1966, now abandoned and assigned to the present assignee, the disclosure of which is incorporated herein by reference thereto.

Patterning of the molybdenum layer on top of the passivating and insulating oxide may be performed by a photochemical and etching process utilizing a photoresist compound, many of which are available and are well known to the art. One such material is sold under the trade name KPR by Eastman Kodak Company of Rochester, N.Y., and is described in an Eastman Kodak Company publication entitled "Photosensitive Resists for Industry," published in 1962, Patterning, utilizing the photoresist, is done by spreading a layer of photoresist material over the entire surface of the exposed molybdenum film and exposing the photoresist through a masking pattern to an appropriate wavelength light, suitable to cause a chemical reaction to occur within the exposed portions of the photoresist material.

Generally, those portions of the metallic film which are desired to be retained are exposed to the fixing radiation of the photoresist covering those portions. In areas of the molybdenum wafer where it is desired that the molybdenum be etched away, the photoresist and coatings thereon is immersed in a developer, furnished by Eastman Kodak Company, for example, and known as Photoresist Developer. This developer causes the unexposed portion of the photoresist material to be washed away while causing the exposed portions to form a gel which is resistant to removal and, after washing in the developer, remains in place.

After developing, the pattern of photoresist upon the surface of the coated wafer is essentially the pattern which is desired to be formed in the metallic molybdenum coating. Following developing of the photoresist, the wafer is washed in distilled water and subjected to a ferricyanide etch bath to remove the metallic molybdenum surface at the exposed portions thereof. Since the ferricyanide etch etches away molybdenum at a rate of aproximately 9000 A.U. thick layer of molybdenum need be immersed for only ⅑ minute whereas a 5000 A.U. thick molybdenum fill would require that the wafer be immersed in the ferricyanide etch containing, for example, 92 grams $K_3Fe(CN)_6$, 20 grams KOH, 300 grams $H_2O$; for approximately one half minute.

Figure 2:
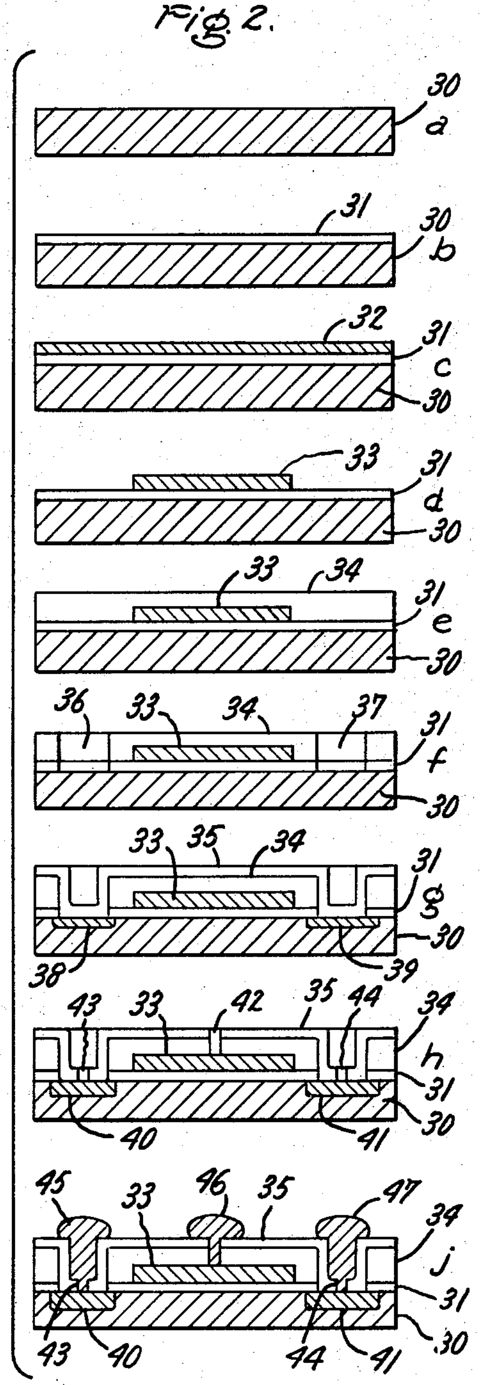

After removal of all of the molybdenum that is not covered by the developed photoresist, the wafer is washed in distilled water and is then scrubbed with trichloroethylene or any other suitable photoresist stripper. After removal of the photoresist, the entire wafer is then subjected to a process for coating the same with a thin film 13 of approximately 1000 to 5000 A.U. of an insulator which may be silicon dioxide, silicon nitride, or silicon oxynitride. In general the same insulator as is initially utilized to coat the silicon substrate is used as the second insulating layer, although this is not necessary. On the other hand, if a capacitor is to be formed between a pair of spaced parallel plates formed in accord with the present invention, the film deposited immediately over the patterned metallic film may be a material which is chosed to have the appropriate dielectric constant and breakdown strength. Many such materials being well known to those skilled in the art. One such material having excellent high-field breakdown strength is silicon dioxide. The oxide-coated silicon wafer is represented in FIG. 2*b* of the drawing. The metallic film coated wafer is shown in FIG. 2*c*, the etched metallic film-covered wafer is shown in FIG. 2*d*, and the insulated-coated wafer is shown in FIG. 2*e*. In all the aforementioned illustrations, it should be understood that the representation of film thickness is greatly disproportionate, since these films are of the order of 1000 to 5000 A.U., which is an insignificant fraction of the thickness of wafer 10, and if represented in true proportion would be invisible. Accordingly, the thickness as illustrated in FIG. 2 and other figures of the drawing is greatly disproportionate.

After the formation of the insulating film 13 over metallic film 12, which has been patterned to the desired shape and size, a number of modifications may result in a number of different embodiments of devices in accord with the invention. In the simplest, the illustrations of FIGS. 1 and 2 will be continued to show the formation of a single burried conductive strip, as for example, a connecting conductor integrated circuit components in a monolithic semiconductor integrated circuit.

Instead of making contact to conducting member 12 at this point, if an integrated circuit is fabricated, as is conventional, further device processing steps such as high temperature diffusion may be carried out and the making of contact to the buried conducting film made after such steps. When these steps are concluded, a metalizing step may be used to make point-to-point contact between conductors.

In accord with the next step of the basic process, the conductor is already buried and it remains only to make electrical contact thereto. To accomplish this the entire wafer is covered with a suitable photoresist, as for example KPR, which is irradiated to provide for a suitable etch mask, in this instance, covering all but portions over patterned metallic film 12 which is to be the contact area, or which is to interconnect two or more electrical conductors or different regions of active or inactive circuit element, and after removing of the mask through which the photoresist is irradiated and developing of the photoresist, the wafer is washed with a suitable etchant for the insulating film, as for example Buffered HF one part concentrated HF solution plus ten parts by volume 40 percent $NH_4F$ solution) in the case of silicon dioxide. Due to the fact that the molybdenum film is resistant to etchants normally used to etch such insulating layers, it serves as an "etch-stop" and thereby protects the underlying insulating film from attack by this etching step. After the removal of the photoresist, the remaining wafer having a major surface consisting essentially of insulating coating 13 with an aperture 14 therein through which metallic film 12 is visible, and which is illustrated in FIG. 2*f*, is then subjected to a metalizing step.

In accord with the metalizing step, a suitable metal, as for example aluminum, may be vacuum evaporated or sputtered in an inert atmosphere, as for example argon, to form a metallic coating over the entire surface of oxide film 13 and filling aperture 14 making contact with film 12. Subsequent to this metalizing step, the photoresist and etching technique may again be utilized to form an etch mask over the aluminum so as to make it possible to remove, by appropriate etching, as for example with an etchant consisting of 76 volumetric percent of orthophosphoric acid, 6 volume percent of glacial acetic acid, 3 volume percent of nitric acid and 15 volume percent of water. The etched contact material 15 which remains, fills aperture 14 in insulating layer 13 and leaves a slight protuberance 16 on the surface of film 13 to which electrical contact may be made by additional plating means or by conventional contact means, assuming that this contact is to be made a terminal of the integrated circuit.

At this point a great advantage over devices and processes of the prior art of integrated circuitry becomes apparent. In accord with prior techniques, all active device formation had to be completed because conventional contact making techniques and materials resulted in contact members which could not withstand the temperature necessary for device formation (i.e. diffusion), without adverse effects upon the contact materials and the insulators adjacent thereto.

In accord with the present invention, these limitations are removed. Thus, provision for electrical contact between parts of the same device, or between different devices may be made prior to or during device fabrication because conducting members made in accord with the present invention are able to withstand device fabrication temperatures without any adverse effects to the contact members or the adjacent materials.

In accord with this embodiment of the invention, a plurality of contact members which are utilized to make electrical connection to various regions of a semiconductor wafer, upon which a monolithic integrated circuit stage is constructed, may be fabricated in series without making actual contact between the individual films until it is desired. Naturally, if contact is to be made between a pair of intersecting films, contact must be made before the last deposited film is covered. On the other hand, it may not be necessary to contact a particular conductor until all films have been deposited. This is greatly advantageous, in that the metallic contact or connection resulting from the buried metallic film need not be exposed to ambient air and will be greatly protected from corrosion and reacting with etchants during semiconductor device fabrication, it being necessary to make contact thereto only after the device is fabricated. It is then only necessary to etch through the insulating layers with a suitable etchant which may be Buffered HF (one part HF and ten parts ammonium chloride) in the case of silicon dioxide; 85 percent phosphoric acid in the case of silicon nitride and silicon oxynitride; or hydrofluoric acid for silicon nitride (when no $SiO_2$ is present).

Formation of a plurality of similar field-effect transistors or a single wafer is started with the selection of an appropriate monocrystalline wafer 30 of silicon which may, for example, be one inch in diameter and 1.014 inches thick. Wafer 30 is doped to have the desired conductivity characteristic as, for example, with approximately $10^{15}$ atom per cc. of phsophorus or boron to secure N-type or P-type conductivity, respectively. Upon wafer 30, an insulating layer 31 is formed. As with the insulating layer of FIG. 2, this insulating layer may be silicon dioxide which may conveniently be formed thermally by heating in an atmosphere of dry oxygen for approximately one hour at a temperature of 1100–1200° C,. or a layer of silicon nitride or silicon oxynitride of approximately 1000 A.U. thickness may be deposited thereupon by the pyrolithic reaction between silane, ammonia, and oxygen upon a silicon substrate heated to approximately 1100° C., as is disclosed in the aforementioned Heumann application. Alternatively, any desired combination of the above may be used. For example, a 1000 A.U. layer of thermally grown $SiO_2$ may be covered with a 1000 A.U. film of $Si_3N_4$.

After a suitable insulating layer 31 has been formed, a thin metallic layer 32 of a metal, such as molybdenum or tungsten, which is nonreactive with silicon oxide, silicon nitride, and silicon oxynitride at the temperatures of the order of 1000–1500° C.; which is unaffected by etchants conventially utilized to pattern these materials (etchants usually containing hydrofluoric acids); is deposited as is illustrated in FIG. *5c*. To form a field-effect transistor, the molybdenum film 32 is patterned using photoresist and etching techniques as is described hereinbefore, so as to leave only a gate electrode which may, for example, have a dimension of 50 microns square. After the patterning of gate electrode 33, a second insulating-passivating film 34 is deposited thereupon, as is described hereinbefore, and as illustrated in FIG. *6e* of the drawing. In future processing of the semiconducting device in accord with the present invention, the molybdenum film encased in insulating-passivating layers 31 and 34, is uneffected thereby and does not react therewith so as to deleteriously effect their insulating and passivating characteristics.

The next step in the formation of the field-effect transistor is to etch holes in layers 31 and 34 to provide for source and drain regions of the field-effect transistor. This may conveniently be done by applying a layer of photoresist over the entire surface of insulating film 34 and utilizing a suitable mask to irradiate all of the photoresist except regions 36 and 37 which are to be the source and drain regions. As illustrated in FIG. 6, the device does not have radial symmetry but is rather illustrated as a device having longitudinal symmetry. Accordingly, regions 36 and 37 are not portions of an annulus but are discrete regions. After the photoresist has been developed over all but regions 36 and 37, at which the unexposed photoresist is removed, the oxide, nitride or oxynitride layers thereunder are etched away exposing the silicon substrate. To remove silicon dioxide or silicon oxynitride a buffered HF etchant, described hereinbefore, may be utilized, whereas if silicon nitride is used, an etchant comprising approximately 85 weight percent $H_3PO_4$ (remainder water) used at approximately 180° C., or a concentrated HF etchant may be utilized for this purpose. The wafer, after regions 36 and 37 of film 34 have been etched away, is illustrated in FIG. *6f*. After the etching of regions 36 and 37, the wafer is washed in distilled water and a suitable activator impurity is diffused through apertures 36 and 37 to cause the surface adjacent regions of substrate 30 to have the conductivity characteristics thereof modified. Thus, for example, if region 30 originally possesses N-type conductivity characteristics, a pair of P-type surface-adjacent, conductivity-modified regions 38 and 39 may be created therein by diffusion of boron through regions 36 and 37 of oxide film 34. For example, boron may be diffused, either from a gaseous atmosphere, with the wafer at a temperature of 1100° C., and a flow of gas passing continuously over the wafer. The flow comprises, for example, 1900 cc. per minute of $N_2$, 1800 cc. per minute of a mixture of 0.25 volume percent of $BCl_3$, in nitrogen, one cc. per minute of oxygen and 0.5 cc. per minute $H_2$, for a period of approximately 0.5 hour. During this process, boron diffuses into the surface of the silicon and forms small diffused regions 38 and 39. A light etch of, for example, 15 seconds removes any boron glass formed on film 34. The entire wafer is then covered with a protective film 35 of about 2000 A.U. thick of $SiO_2$, $Si_3N_4$, or silicon oxynitride.

The wafer is heated at a temperature of approximately 1100° C. for a sufficient time to diffuse the previously-diffused boron in regions 38 and 39 outwardly, so as to extend beneath the central portion of molybdenum film 33. For a device in which the edge of aperture 36 extends 0.0001 inch over the edge of molybdenum film 33, approximately four hours time is sufficient. An overlap distance of 0.0002 inch requires 16 hours. The time required increases as the square of the overlap distance. By this step, source and drain regions 40 and 41 are formed to a depth of approximately 20 A.U.

Alternatively, if the wafer 30 possesses P-type conductivity characteristics, N-type conductivity modified source and drain regions 38 and 39 may be formed by heating the wafer for approximately one half hour to a temperature of approximately 1000° C. in a reaction vessel containing a quality $P_2O_5$ which, at this temperaurte, volatilizes and reacts with the wafer to form regions 38 and 39, heavily doped with phosphorus, and reacts with the $SiO_2$ of film 34 to form a region of phosphorus-rich glass. This glass may be removed along with excess $P_2O_5$ on the surface of the silicon by etching the wafer in an etchant comprising 15 cc. concentrated HF, 10 cc. concentrated $HNO_2$, and 300 cc. $H_2O$ for about 15 seconds and rinsing in distilled $H_2O$. As in the boron diffusion example, the first-diffused wafer is covered with an insulating film 35, and the wafer is baked at approximately 1100° C. for approximately either 4 or 16 hours in an inert atmosphere, as for example argon, to form regions 40 and 41 for the dimensions given hereinbefore.

Subsequent to the formation of surface-adjacent regions 48 and 49 in substrate 30, photoresist and etching techniques are again utilized to etch a hole to the molybdenum film utilizing a suitable etchant, for example, concentrated HF, to form a hole 42 in film 34, exposing a portion of molybdenum film 33. Similarly holes 43 and 44 are etched in film 35 to expose a portion of source and drain regions 40 and 41. Subsequent thereto, the entire surface of the wafer may be metallized, as for example, by vacuum evaporation, and suitable etching and masking techniques, utilizing photoresists, are used to form a pattern on the metallic coating so that upon removal of portions thereof, only electrical contacts 45 to source region 40, 46 to gate 33, and 47 to drain region 41 remain.

In the operation of an enhancement mode FET, conductivity between source and drain regions 40 and 41 respectively, is through a thin P or N-type channel formed by application of an appropriate polarity voltage to the gate electrode. As a practical matter, it is desired that the channel length from source to drain regions be as short as possible, and of substantial width. The gate is therefore, somewhat wider than the length of the channel and somewhat longer than its width. Due to these geometric limitations of the foregoing, "landing pads" are normally provided and are regions of enlarged dimensions adjacent the active portion of the gate to form electric contact means. The drawing, being schematic, does not show this.

The foregoing description relates to enhancement mode FET devices wherein the channel between source and drain is created by the application of voltage to the gate. A similar device, a depletion mode FET, wherein an existing channel is modulated by depletion of the charge therein, may be formed in accord with the present invention without the necessity of requiring the source and drain regions to extend under the gate electrode.

In accord with the foregoing, I have disclosed in, several embodiments, the formation of varied metallic conducting films of etch-resistant, nonreactive metals such as molybdenum and tungsten buried within oxide, nitride, or oxynitride films of silicon semiconductor devices, for example, for the formation of integrated circuits and components which greatly facilitate construction of such devices and the ready access to such contacts at any time in the fabrication process desired. Of great advantage, in this respect, is the adaptability of the invention for the provision of buried metallic conducting members in integrated circuit modules prior to the completion of the fabrication of active device components and the subsequent contact and interconnecting thereof.

While the invention has been disclosed herein with respect to certain specific embodiments thereof, many modifications and changes will readily occur to those skilled in the art. Accordingly, I intend by the appended claims to cover all such modifications and changes as fall within the true spirit and scope of the present invention.

What is claimed is:

1. A method of forming a field-effect transistor having source and drain regions of opposite conductivity type adjacent a surface of a semiconductor body of one conductivity type and separated by a surface adjacent channel region having a gate electrode juxtaposed thereover but insulated therefrom, which method comprises:

(a) preparing a semiconductor body of one conductivity type having a substantially planar major surface;

(b) forming a thin continuous insulating film over said surface of said body;

(c) depositing a metallic film which is nonreactive with said insulating film thereover;

(d) patterning said deposited metallic film to form said gate electrode;

(e) depositing a second insulating film over said wafer to cover said patterned metallic gate electrode and said first-formed insulating film;

(f) photochemically masking said coated body to define source and drain apertures;

(g) etching source and drain apertures in said insulating film to expose discrete portions of semiconductor surface;

(h) diffusing opposite conductivity type inducing activator through said source and drain apertures to form surface-adjacent source and drain regions of opposite conductivity type separated by said surface channel;

(i) making electrical contact to said source and drain regions through said apertures;

(j) etching an aperture in said last deposited insulating film to expose a portion of said gate electrode and making electrical contact thereto.

2. The method of claim 1 wherein said insulating films are composed of at least one material selected from the group consisting of silicon dioxide, silicon nitride, and silicon oxynitride.

3. The method of claim 1 wherein said semiconductor body is silicon and said first-formed insulating film is thermally grown silicon dioxide.

4. The method of claim 1 wherein said source and drain regions are diffused slightly beneath said gate electrode to form an enhancement mode device.

5. The method of claim 1 wherein said source and drain regions are not diffused beneath said gate electrode to form a depletion mode device.

6. The method of claim 5 wherein said apertures are filled entirely with electrical contacting metallic material to isolate source and drain regions from ambient.

7. The method of claim 1 wherein said conducting metallic film is of a refractory metal.

8. The method of claim 1 wherein said film is of molybdenum.

9. The method of claim 1 wherein said semiconductor material is silicon, said first-deposited insulating film is thermally grown silicon dioxide and said metallic film is of molybdenum.

References Cited

UNITED STATES PATENTS

| | | | |
|---|---|---|---|
| 3,165,430 | 1/1965 | Hugle | 29—571UX |
| 3,457,125 | 7/1969 | Kerr | 29—571X |
| 3,472,712 | 10/1969 | Bower | 29—571X |

JOHN F. CAMPBELL, Primary Examiner

W. TUPMAN, Assistant Examiner

U.S. Cl. X.R.

29—588, 628; 317—235